United States Patent [19]

Duryea

[11] Patent Number: 4,952,802

[45] Date of Patent: Aug. 28, 1990

[54] ION DETECTION APPARATUS

[75] Inventor: Anthony N. Duryea, Cheswick, Pa.

[73] Assignee: Leybold Inficon, Inc., East Syracuse, N.Y.

[21] Appl. No.: 226,262

[22] Filed: Jul. 29, 1988

[51] Int. Cl.[5] ...................... H01J 49/14; H01J 37/063

[52] U.S. Cl. .................................... 250/288; 250/427; 313/361.1; 313/363.1; 313/146

[58] Field of Search .................. 250/288, 288 A, 427, 250/423 R; 313/361.1, 363.1, 146

[56] References Cited

U.S. PATENT DOCUMENTS

| | | | |
|---|---|---|---|
| 2,882,410 | 4/1959 | Brobeck | 250/41.9 |
| 3,073,951 | 1/1963 | Burdg | 250/41.9 |
| 3,356,843 | 12/1967 | McElligott | 250/427 |
| 3,590,243 | 6/1971 | Perrin et al. | 250/419 S |
| 4,298,795 | 11/1981 | Takeuchi et al. | 250/282 |
| 4,454,894 | 6/1984 | Tallon | 137/599 |
| 4,663,525 | 5/1987 | Ohtsuki et al. | 250/310 |

*Primary Examiner*—Jack I. Berman

*Attorney, Agent, or Firm*—Arnold B. Silverman

[57] ABSTRACT

Ion detection apparatus has an ionizer provided with an ionizer volume for receiving a specimen to be analyzed. An electron gun is operatively associated with the ionizer for bombarding the specimen with an electron beam and converting the specimen into ions. An analyzer receives the ions from the ionizer volume and includes a detector for detecting the ions. The electron gun has focusing means for varying the size and intensity of the electron beam. The electron gun may have an accelerating anode, a focusing collimator and a second anode. The ionizer means may have an extractor lens and collimating lens as well as a groundplate. The ionizer means may have an electron collecting plate for receiving electrons which pass through the ionizer volume and providing feedback regarding the electron beam.

13 Claims, 4 Drawing Sheets

ION DETECTION APPARATUS

BACKGROUND OF THE INVENTION

1. Field of the Invention

The present invention relates to an improved ion detector system, and, more specifically, it relates to unique electron gun means and ionizer means for use in such a system.

2. Description of the Prior Art

It has been known to use mass spectrometers in ascertaining the identity and quantity of components of gaseous liquid or solid specimens. It has also been known in connection with such apparatus to employ vacuum in analyzing a specimen through conversion of the molecules into ionic form and permitting the ions to bombard a detector. See generally U.S. Pat. Nos. 2,882,410; 3,073,951; 3,590,243; 4,298,795; and 4,454,894. See also my U.S. patent application Ser. No. 83,376, filed Aug. 10, 1987.

Conventional ionizer designs have a filament which establishes the electron beam fixed in position within about 1 to 2 millimeters from the ionizer aperture. This limits flexibility of use of the equipment and with respect to liquid chromatography interfaces contributes to filament deterioration.

There remains, therefore, a very real and substantial need for an improved ion detector system which provides for more efficient establishing of the electron beam current.

SUMMARY OF THE INVENTION

The present invention has met the above described need. It provides an electron gun which cooperates with ionizer means in establishing a bombarding electron beam which may be focused to vary the size of the beam and the intensity of the same.

In addition, the system provides a collector plate cooperating with the ion volume of the ionizer means to receive the portion of the bombarding electron beam which passes through the ion volume. This collector plate serves as a means for providing feedback to permit control of the electron emission current and thereby maintain the desired level of electron emission.

It is also preferred to provide quick disconnect means which facilitate removal of the electron gun means, the ionizer means and the detector means from the rest of the ion detector apparatus.

It is an object of the present invention to provide ion detector apparatus which is adapted to have improved efficiency as a result of an electron gun means which can be focused.

It is a further object of the present invention to provide such a system wherein rapid removal of the electron gun means and ionizer means are facilitated.

It is another object of the present invention to provide an electron gun means and and ionizer which may be made so economically so as to be disposable.

It is a further object of the present invention to provide for improved control over flow of electrons by means of a feedback system.

It is a further object of the this invention to provide a system which facilitates the use of higher pressures in the ion volume without enhancing the likelihood of filament deterioration.

These and other objects of the invention will be fully understood from the following description of the invention on reference to the illustrations appended hereto.

BRIEF DESCRIPTION OF THE DRAWINGS

FIG. 2(*a*) is a cross-sectional illustration of a portion of the gun mount of FIG. 2.

DESCRIPTION OF THE PREFERRED EMBODIMENTS

While for convenience of reference herein, the expression "ion detector apparatus" will be employed It will be understood that the type of system may involve gas chromatography/mass spectrometry, liquid chromatography/mass spectrometry gas analysis using mass spectrometry and supercritical fluid chromatography.

Figure 1:
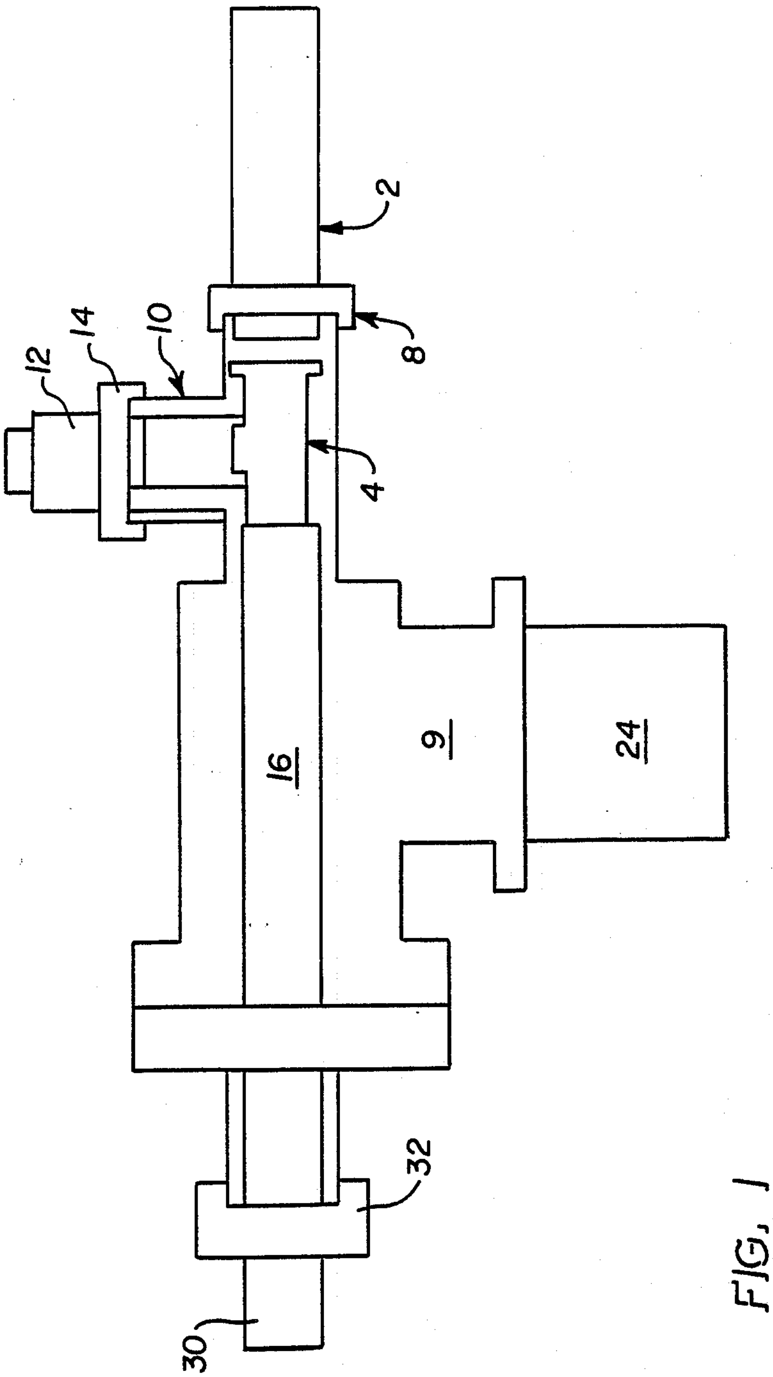
FIG. 1 is a schematic illustration of a form of apparatus of the present invention.

Referring more specifically to FIG. 1 there is shown ion detector apparatus ionizer means 2 which include an ionizer volume 4. The ionizer means 2 may be rapidly removed from the remainder of the apparatus by rotatable, quick disconnect member 8 which is threadedly secured to a portion of the housing 9. Electron gun means 10 has a gun mount 12 and a quick disconnect mechanism 14 which is threadedly secured to a portion of the housing 9 and facilitates rapid removal thereof. As in a preferred embodiment of the invention, both the electron gun means 10 and the ionizer means 2 may be made economically so as to be disposable members, these quick disconnect elements 8, 14 facilitate rapid replacement.

A specimen to be analyzed will be introduced into the ionizer volume 4 by means to be described hereinafter wherein the molecules will be bombarded by an electron beam originating with electron gun 10 to convert the molecules into ions. These ions will travel into analyzer means 16 and ultimately to detector 30 which will serve to identify the nature of the material and provide an indication of the quantity present. The housing 9 is operatively associated with the vacuum pump 24 which will serve to establish a partial vacuum within the housing 9. A quick disconnect member 32 serves to threadedly secure the detector 30 to the remainder of the housing.

Figure 2:
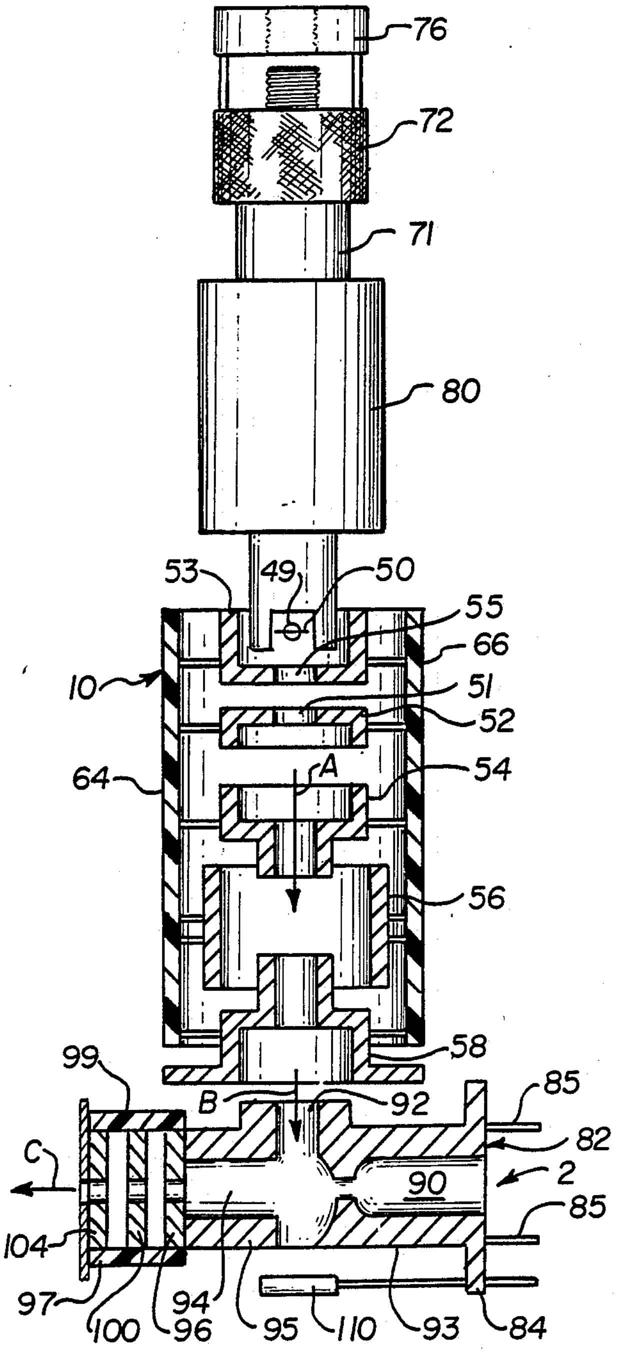
FIG. 2 is a cross-sectional illustration showing portions of the electron gun means and ionizer means.
Figure 2A:
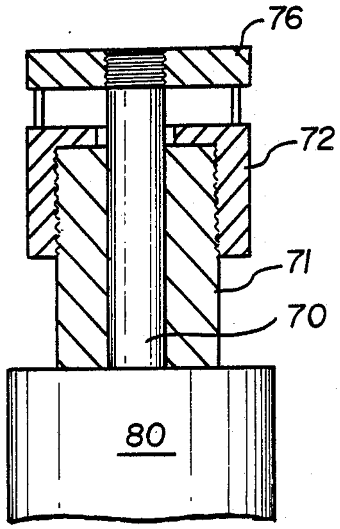

Referring more specifically to FIG. 2, additional details of the ionizer means and electron gun assembly will be considered. The electron gun 10 has a filament 50 which is disposed in spaced adjacent relationship with respect to extraction plate 52. Annular shield 53 serves to protectively surround the filament 50 and facilitate mounting of the electron gun. Extraction plate 52 and 53 have, respectively, openings 51, 55 through which electrons pass.

Also shown as part of the gun are accelerating anode 54, focusing collimator 56 and second anode 58. These elements 54, 56, and 58 serve to facilitate focusing and directing the electron beam. Each of these elements is preferably of tubular generally cylindrical configuration but are illustrated in section herein. A plurality of elongated longitudinally extending electrically insulative mounting poles 64, 66 serve to secure the assembly in such manner that the components are fixed in relative spaced relationship and electrically insulated one or two circumferentially spaced additional such poles (not shown) may be employed, if desired.

One of the advantageous features of the present invention is the ability to focus the electron beam which will emerge from the filament 50 and pass generally downwardly emerging from the electron gun adjacent to second anode 58 and entering the passageway 92 into ionizer volume 90. A preferred method of accomplishing this focusing which not only controls beam size, but also intensity of beams is to provide means for establishing relative closing and separating movement between the filament 50 and the extraction plate 52. When relative separating movement is established, this results in a focusing of the electron beam to the desired position for maximum sensitivity as viewed from the output of the detector 30 (FIG. 1) as displayed on suitable visual display, such as oscilloscope. The filament 50 and the extraction plate 52, as well as focusing collimator 56 and anodes 54, 58 are preferably composed of a material such as stainless steel, for example.

Referring to FIGS. 2 and 2(*a*), in the preferred embodiment of the invention, a rod 70 is generally cylindrical and slides through a passageway in disconnect 72. Rotating nut 76, in a first direction, puts pressure on quick disconnect 72 thereby pulling rod 72 upwardly turning nut 76 in the opposite direction will permit rod 72 to move into quick disconnect 72 in a downward direction. These movements serve to adjust the position of the filament 50 with respect to extraction plate 52

Rotating nut 76 will, therefore, effect in or out movement of stainless steel rod 70 and translation of filament 50. Appropriate electrical pin connections are provided in region 80 in order to facilitate electrically energizing the filament 50.

In general, it will be preferred that the filament 50 be provided in the form of a ribbon retained within slotted sleeve 49 and that it be spaced about 1 to 5 millimeters from the extraction plate 52. The electrons under the influence of the voltage imposed upon the accelerating anode 54, the focusing collimator 56, and the second anode 58, serve to be collimated into a beam and accelerated or decelerated. The energy of the beam is related to the voltage placed on the extraction plate 52 and collimating cylinder 56.

The configuration of the electron beam is established by means of the aperture 51 of the extraction plate 52.

A voltage is applied to first anode 54 electron beam to facilitate focusing. The exit or second anode is electrically tied to extractor plate 52 and will generally be at the same potential as the ion volume 90.

By way of example, the filament 50 will generally be in a voltage between about minus 200v to −10v with respect the ionizer volume 90. The first anode will have a voltage variable between about 10 to 200 volts and the focusing collimator 56 will have a voltage of about 0 to 20 volts with the exit or second anode 58 being at ion volume potential. Increasing the voltages imposed on the extraction plate 52 and collimating cylinder 56 will accelerate the electrons and provide a varying focused beam into the ionizer. This voltage change can, therefore, assist with focusing in addition to relative movement of the filament 50 and extraction plate 52.

The electron beam will travel in the direction indicated by the vertical arrows A and B in FIG. 2.

Referring still to FIG. 2, the ionizer means 2 will receive the specimen to be analyzed through passageway 90 and the specimen molecules will be bombarded by the electron beam with the ions formed thereby exiting to the left through passageway 94 into the analyzer 16 (not shown in FIG. 1). The ionizer means has an extractor lens 96 which serves to facilitate passage of ions therethrough and a collimating lens 100 which serves to extract the ions and focus. A groundplate 104 serves to slow the ion flow into the quadrupole 16. Annular member 82 has flange 84 and defines ion volume 90. Annular member 95 defines a portion of passageway 94 and cooperates with member 82 to define passageway 92. Tubular cylindrical housing 93 cooperates with electrically insulative members 97, 99 to retain the ionizer components in desired positions. A plurality of electrical pins 85 project to the right (as shown in FIG. 2) for effecting electrical energizing of ionizer 2. It will be appreciated that in this manner effecting focusing of the electron beam by means of the unique electron gun construction facilitates sufficient control over the size, shape and intensity of the electron beam which impinges upon this specimen in the ionizer volume. Such adjustment may be effected during operation of the apparatus, if desired.

As shown in FIG. 2, the portion of the electron beam entering passageway 92 of the ionizer means 2 and passing through the same will impinge upon the electron collecting plate 110. This collecting plate 110 serves to provide feedback regarding the nature of the electron beam and facilitate improved control over the system.

Figure 3:
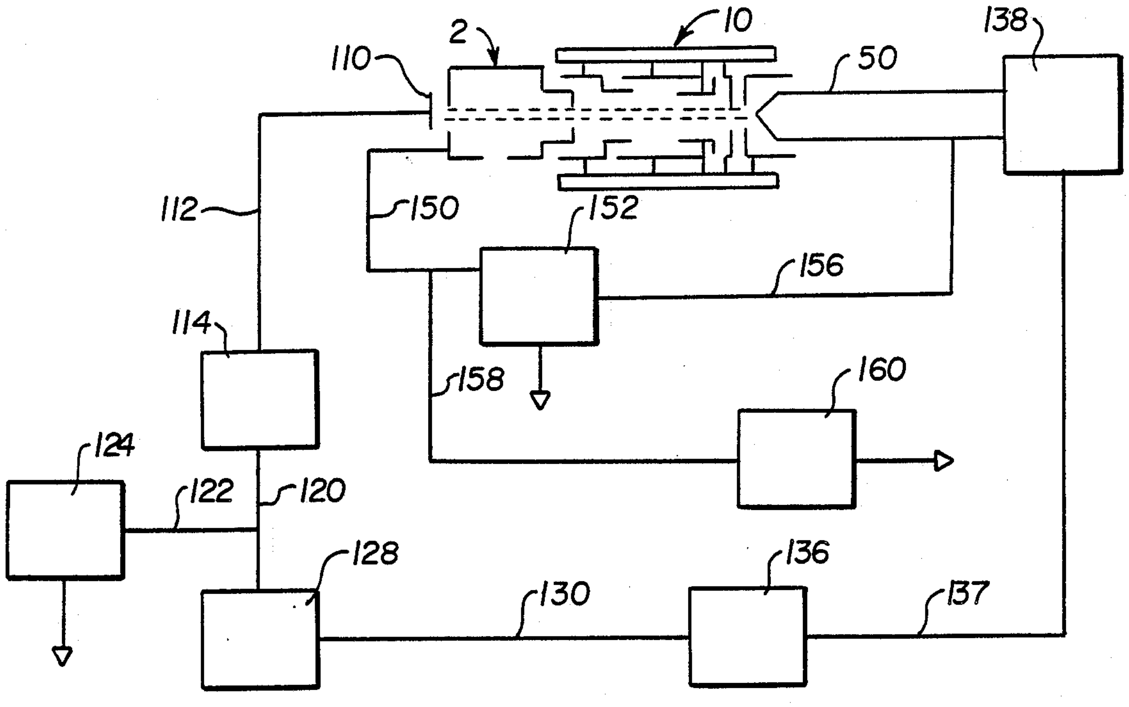
FIG. 3 is a schematic illustration of a portion of the electrical system of the present invention.

Referring to FIG. 3, there is shown schematically the filament 50 of the electron gun 10 emitting an electron beam moving from right to left into the ion volume 2. Collector 110 receives the portion of the electron passing through ion volume Collector 110 is coupled by lead 112 to current to voltage converter 114 which is connected by lead 120 to an LED driver 128 and to voltage supply 124 by lead 122. LED driver 128 is coupled by lead 130 to the optical coupler 136 which is connected to filament supply 138 by lead 137 and is in the feedback loop used to regulate the filament current for stability of emission. Lead 150 is connected to the ion volume 2 and electron energy voltage supply 152 and ion energy supply 160. Lead 156 is the common connection from the filament 50 to the electron energy supply for ground reference.

It will be appreciated that in this manner, by providing this feedback, the system effects more efficient control over the electron beam and permits adjustment through focusing to facilitate such enhanced efficiency.

Figure 4:
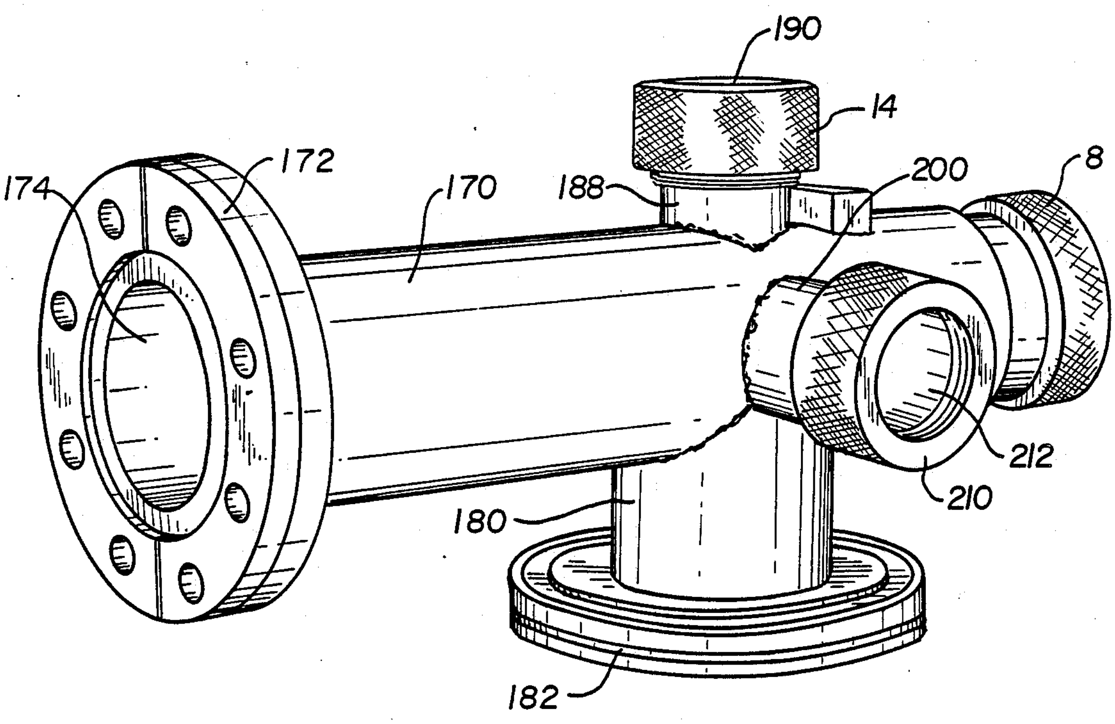
FIG. 4 is a perspective view of a form of housing employed in the present invention.

FIG. 4 shows a form of housing suitable for use in the ion detection apparatus of the present invention. The housing has an elongated tubular body 170 terminating at one end in a flange 172 which provides an opening 174, within which the assembly housing detector 30 may be secured after the analyzer means 16 are inserted within the bore of 170 and tubular projection 180 is in communication with the bore of tube 170 and terminates into flange 182. Vacuum pump 24 FIG. 1 may be sealingly secured to this opening.

The ionizer unit tube by means of quick disconnect 8 is secured in the end of the housing opposed to that which receives the detector 30. A tubular extension 188 has a bore 190 in communication with bore 170 and by means of quick disconnect 14 secures the electron gun means in position. Finally, a source of the specimen to be analyzed is secured to tubular extension 120 which has quick disconnect 210 and opening 212 to introduce the specimen into the ionizer volume.

Figure 5:
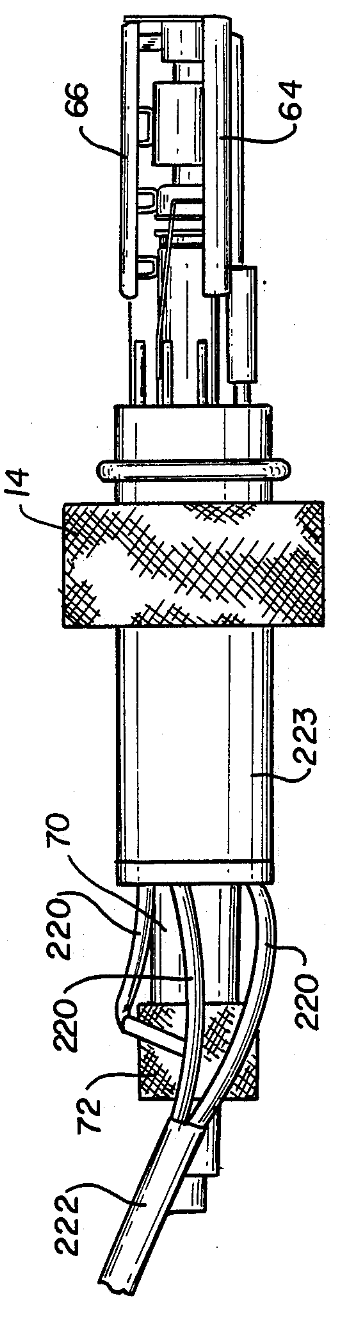
FIG. 5 is an elevational view of a form of electron gun means of the present invention.

Referring to FIG. 5, there is shown the electron gun means with the electrical wires 220 from a source of electrical energy through 222 serving to energize the filament. The nut 72 is rotated when it is desired to move the rod 70 so as to alter the spacing between the filament 50 and the extraction plate 52. Vacuum tight housing 223 contains electrical connections for electron gun 10.

Figure 6:
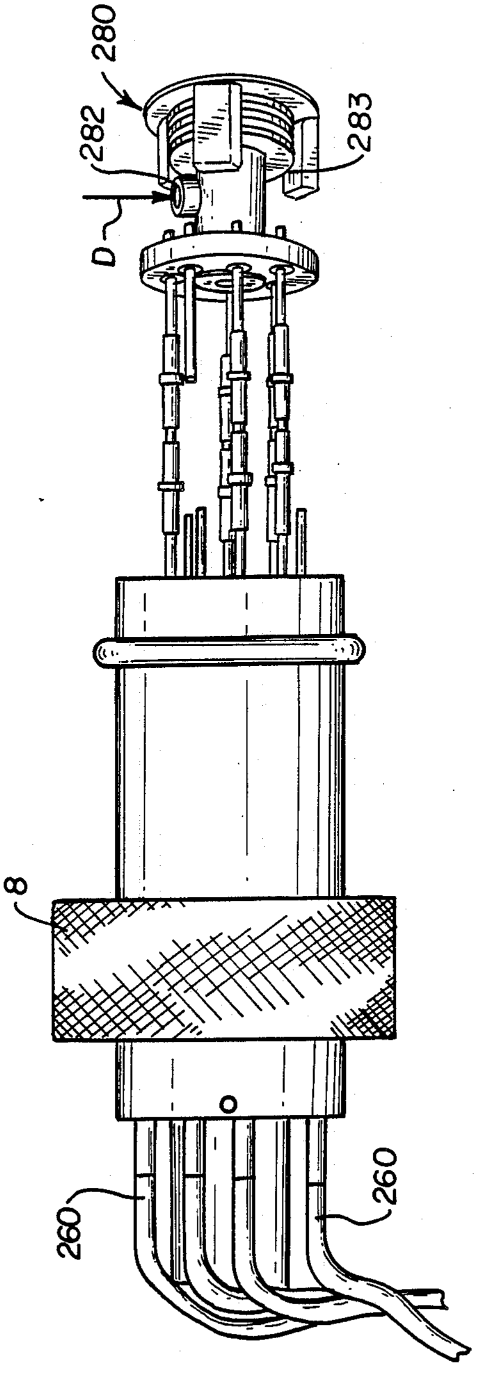
FIG. 6 is an elevational view of a form of ionizer means of the present invention.

Referring to FIG. 6 there is shown the ionizer means which are secured to the housing by means of quick disconnect 8. The electrical energy input means 260 are shown toward the left and the ionizer volume containing portion 280 is shown at the right. The electron beam will be introduced into the ionizer volume through opening 282 with the beam being directed in the manner indicated by arrow capital D.

It will be appreciated that the present invention has provided a unique system for establishing a more efficient ion detection system through permitting focusing of the electron beam generated by the electron gun means. In this manner, the most efficient use of the system may be achieved. Also, in a preferred embodiment, the collector plate 110 provides feedback which facilitates imposing the appropriate voltages on the electron in order to more effectively control the operation of the system.

While purposes of simplicity of disclosure reference has been made herein to a specifically preferred arrangement of components in the ion detection system, it will be appreciated that other approaches will be readily known to those skilled in the art.

Whereas particular embodiments of the invention have been described hereinabove for purposes of illustration, it will be evident to those skilled in the art that numerous variations of the details may be made without departing from the invention as defined in the appended claims.

I claim:

1. Ion detection apparatus comprising, ionizer means having an ionizer volume for receiving a specimen to be analyzed, electron gun means operatively associated with said ionizer means for bombarding said specimen with an electron beam and converting at least portions of said specimen into ions, said electron gun means having a filament and an extraction plate, said extraction plate being disposed on the ionizer means side of said filament, analyzer means for receiving said ions from said ionizer volume, said analyzer means having detector means for detecting the presence of said ions; and said electron gun means also having focusing means for varying the size of said electron beam, said focusing means having means for varying the spacing between said filament and said extraction plate.

2. The ion detection apparatus of claim 1 wherein, said extraction plate disposed in spaced relationship with respect to said filament, and said electron gun means having an accelerator anode disposed in spaced relationship with respect to said extraction plate.

3. The ion detection apparatus of claim 2 including, said electron gun means having a second anode operatively associated with said ionizer means.

4. The ion detection apparatus of claim 3 including, said electron guns means having a focusing collimator interposed between said accelerating anode and said second anode for assisting with focusing said electron beam.

5. The ion detection apparatus of claim 1 including, said focusing means having an adjustment member which when rotated will effect relative translational movement between said filament and said extraction plate.

6. The ion detection apparatus of claim 1 including, said ionizer means having an electron collection plate for receiving portions of said electron beam passing through said ionizer volume, and feedback current means for providing information regarding said electron beam.

7. The ion detection apparatus of claim 1 including, said ion detection apparatus having a vacuum chamber, and vacuum pump means operatively associated with said chamber for establishing at least a partial vacuum therein.

8. The ion detection apparatus of claim 7 including electron gun means having disconnect means for separating said focusing means from said ion detector from the remainder of said ion detector apparatus.

9. The ion detection apparatus of claim 8 including, said ionizer means having disconnect means for separating said ionizer means from the rest of said ion detector apparatus.

10. Electron gun apparatus for use with ion detection means comprising, a filament, an extraction plate, and focusing means for establishing relative movement between said filament and said extraction plate.

11. Electron gun apparatus of claim 10 including, said focusing means having rotatable means which establish relative translational movement of said filament with respect to said extraction plate.

12. Electron gun apparatus of claim 11 including, said electron gun means having an accelerating anode and a second anode.

13. Electron gun apparatus of claim 12 including, focusing collimator means interposed between said accelerating anode and said second anode.

* * * * *